(12) United States Patent
Jao et al.

(10) Patent No.: US 7,256,475 B2
(45) Date of Patent: Aug. 14, 2007

(54) ON-CHIP TEST CIRCUIT FOR ASSESSING CHIP INTEGRITY

(75) Inventors: Jui-Meng Jao, Miao-Li Hsien (TW); Chien-Li Kuo, Hsin-Chu (TW)

(73) Assignee: United Microelectronics Corp., Hsin-Chu (TW)

( * ) Notice: Subject to any disclaimer, the term of this patent is extended or adjusted under 35 U.S.C. 154(b) by 40 days.

(21) Appl. No.: 11/161,304

(22) Filed: Jul. 29, 2005

(65) Prior Publication Data

US 2007/0023915 A1 Feb. 1, 2007

(51) Int. Cl.
*H01L 23/00* (2006.01)

(52) U.S. Cl. ...................... 257/622; 257/620

(58) Field of Classification Search ........... 257/620, 257/622, 640
See application file for complete search history.

(56) References Cited

U.S. PATENT DOCUMENTS

| | | | |
|---|---|---|---|
| 6,365,958 B1 * | 4/2002 | Ibnabdeljalil et al. ........ | 257/620 |
| 2003/0218254 A1 * | 11/2003 | Kurimoto et al. ........... | 257/758 |
| 2005/0184362 A1 * | 8/2005 | Fujita ......................... | 257/620 |

* cited by examiner

*Primary Examiner*—Thomas L. Dickey
(74) *Attorney, Agent, or Firm*—Winston Hsu

(57) ABSTRACT

A semiconductor chip includes an active inner circuit; a die seal ring surrounding the active inner circuit; a first circuit structure fabricated at a first corner of the semiconductor chip outside the die seal ring and electrically connected to the die seal, wherein the first circuit structure has a first solder pad; and a second circuit structure fabricated at a second corner of the semiconductor chip outside the die seal ring and electrically connected to the die seal, wherein the second circuit structure has a second solder pad.

8 Claims, 4 Drawing Sheets

ON-CHIP TEST CIRCUIT FOR ASSESSING CHIP INTEGRITY

BACKGROUND OF THE INVENTION

1. Field of the Invention

The present invention relates generally to the reliability test of semiconductor integrated circuit chips and, more particularly, to an on-chip test circuit constructed at corners of an integrated circuit chip or die for assessing chip integrity.

2. Description of the Prior Art

Semiconductor manufacturers have been shrinking transistor size in integrated circuits (IC) to improve chip performance. This has resulted in increased speed and device density. For sub-micron technology, the RC delay becomes the dominant factor. To facilitate further improvements, semiconductor IC manufacturers have been forced to resort to new materials utilized to reduce the RC delay by either lowering the interconnect wire resistance, or by reducing the capacitance of the inter-layer dielectric (ILD). A significant improvement was achieved by replacing the aluminum (Al) interconnects with copper, which has ~30% lower resistivity than that of Al. Further advances are facilitated by the change of the low-k dielectric materials.

However, one shortcoming associated with the use of low-k dielectrics is that almost all low-k dielectric materials possess relatively lower mechanical strength than that of conventional silicon oxide dielectrics such as FSG or USG. The use of low-k dielectrics poses this industry another problem that the adhesion ability, either at the interface between two adjacent low-k dielectric layers or at the interface between a low-k dielectric layer and a dissimilar dielectric layer, is somewhat inadequate to meet the requirements in the subsequent wafer treatment processes such as wafer dicing, which is typically performed to mechanically cut a semiconductor wafer into a number of individual IC chips.

Delamination or cracking that occurs during scribing, dicing or temperature cycling test is problematic and may cause circuit chip failures. One approach to monitoring of the interface delamination or chip cracking is so-called Scanning Acoustic Tomography (SAT) or Scanning Acoustic Microscopy (SAM) technique. The SAM technique, which can be implemented either after dicing (i.e., bare die check) or after chip packaging (i.e., packaged IC check), utilizes superimposed ultrasonic pulse and echo signals to detect the delamination or cracking defects formed in the integrated circuit chips or packages.

However, the SAM technique has some drawbacks. During the bare die check after dicing, very small cracks are difficult to detect because of the detection limit of the SAM tools. Typically, the detection limit of the commercial SAM tools is about 1 micrometer. On the other hand, even the delamination defect is detectable it is often difficult to characterize the specific location of the defect for the packaged IC check. That is, the information whether the defect is in the interlayer of the IC chip or at the interface between the IC chip and packaging material is not available.

Therefore, a need exists in this industry for a sensitive, but inexpensive approach to the detection of the delamination or cracking defects formed in the integrated circuit chips or packages.

SUMMARY OF THE INVENTION

It is the primary object of the present invention to provide a semiconductor chip having thereon an on-chip test circuit for assessing chip integrity.

According to the claimed invention, a semiconductor chip having test circuit for assessing chip integrity is provided. The semiconductor chip includes an active inner circuit; a die seal ring surrounding the active inner circuit; a first circuit structure fabricated at a first corner of the semiconductor chip outside the die seal ring and electrically connected to the die seal, wherein the first circuit structure has a first solder pad; and a second circuit structure fabricated at a second corner of the semiconductor chip outside the die seal ring and electrically connected to the die seal, wherein the second circuit structure has a second solder pad.

From one aspect of this invention, the semiconductor chip includes an active inner circuit; a die seal ring surrounding the active inner circuit; a first circuit structure fabricated at a corner of the semiconductor chip outside the die seal ring, wherein the first circuit structure has a first solder pad and is not electrically connected to the die seal; and a second circuit structure fabricated adjacent to the first circuit structure at the corner of the semiconductor chip and electrically connected to the first circuit structure, wherein the second circuit structure has a second solder pad.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION

The present invention is directed to an on-chip test circuit constructed at four vulnerable corners of an integrated circuit chip or die for assessing chip integrity. Interface delamination occurs between low-k dielectric layers during or after the wafer dicing. It has been observed that such interface delamination phenomenon is particularly severe at the four corners of a single die or chip, and the interface delamination even penetrates into the active circuit die area protected by a die seal ring or metallic arrester wall, even in combination with a crack-stopping trench slit disposed along the perimeter of each die.

It is believed that the severe interface delamination at the four corners of a single die results from mechanical stress created by the cutting blade during the wafer dicing process. During wafer dicing, either in the form of grinding-cutting or scribing, the aforesaid mechanical stress concentrates on the four corners of an active circuit die area, causing short-term or long-term reliability problems.

Figure 1:
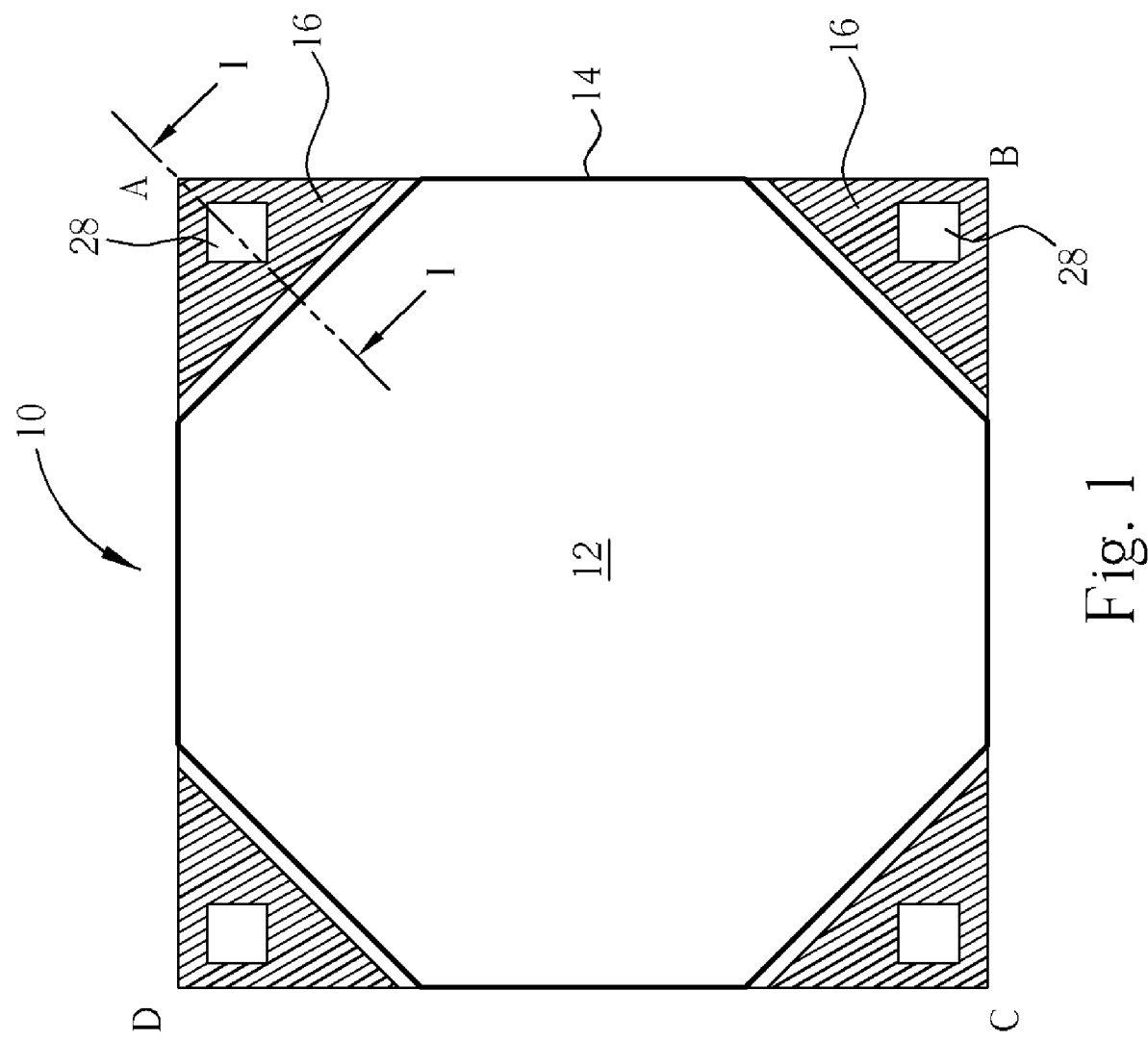
FIG. 1 is a schematic plan view showing an on-chip test circuit constructed at corners of an integrated circuit chip or die for assessing chip integrity in accordance with one preferred embodiment of this invention.
Figure 2:
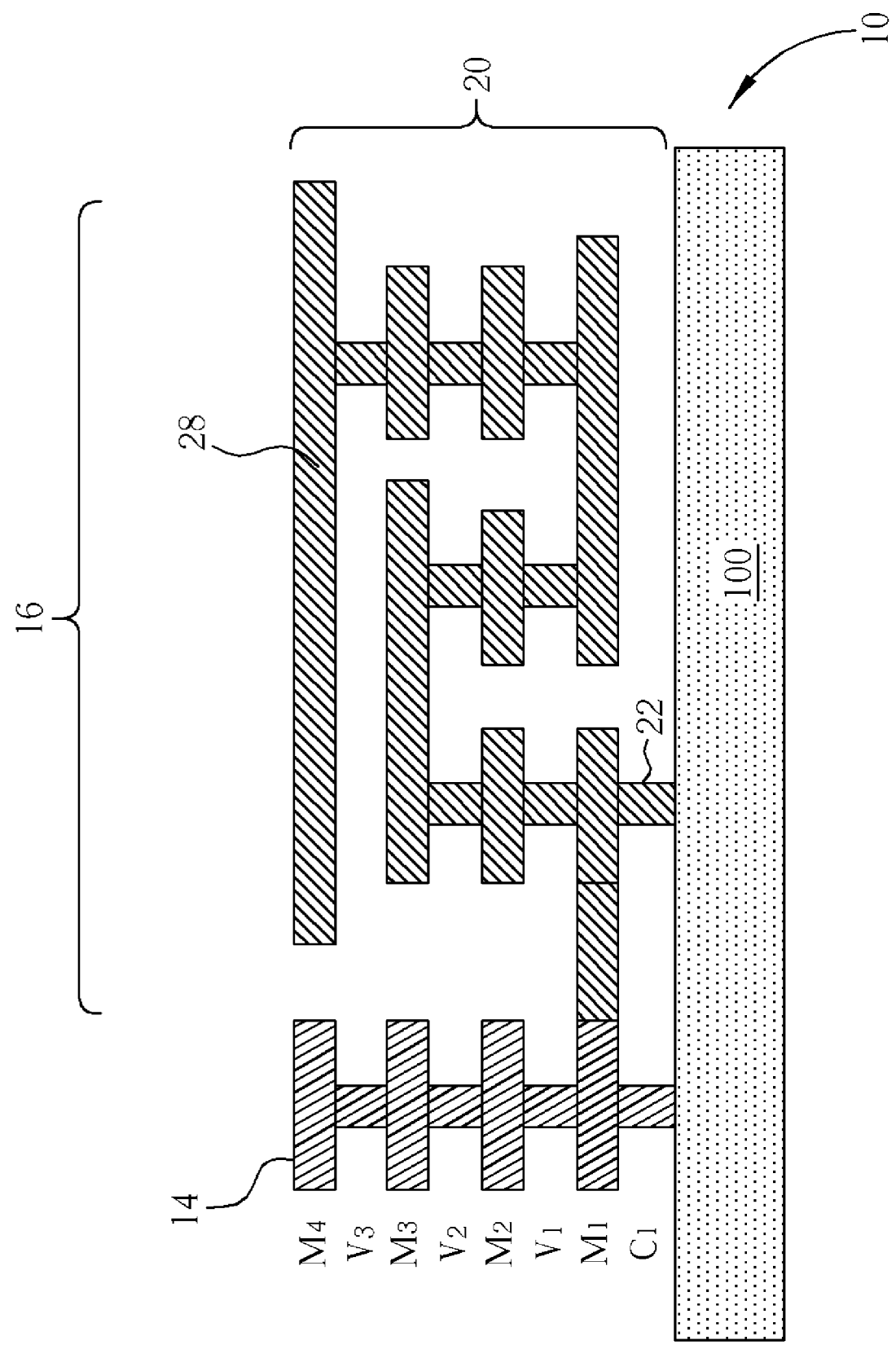
FIG. 2 is a schematic, cross-sectional view taken along line I-I of FIG. 1.

Please refer to FIG. 1 and FIG. 2. FIG. 1 is a schematic plan view showing an on-chip test circuit constructed at corners of an integrated circuit chip or die for assessing chip integrity in accordance with one preferred embodiment of this invention. FIG. 2 is a schematic, cross-sectional view taken along line I-I of FIG. 1. As shown in FIG. 1 and FIG. 2, integrated circuit chip or die 10 includes an active integrated circuit 12 surrounded by a die seal ring 14. Such seal ring structure consists of a plurality of patterned metal layers, positioned on top of each other and mutually connected by via or contact plugs. The seal ring structure is common in the art and is utilized to protect the active integrated circuit 12 from being damaged by cracks originating from the wafer dicing process. The die seal ring 14 may be single seal barrier wall or dual-wall barriers formed in layers of similar or dissimilar dielectric materials.

The seal ring structures are manufactured step by step as sequential depositions of insulators and metals in conjunction together with the fabrication of the integrated circuit elements. Typically, a heavily doped region (not shown) is diffused into the semiconductor material 100 such as a silicon substrate in a process needed otherwise for fabricating strongly doped surface regions in some circuit elements. This heavily doped region serves as an anchor for the seal ring structure to be built, and permits the application of specific electrical potentials to the seal ring structure, such as ground potential or Vss. The fabrication of the seal ring structure is known in the art, and details of this will be skipped over in the following text.

The active integrated circuit 12 may comprise components such as, for example, transistors, diffusions, memory arrays and interconnections. The integrated circuit chip or die 10 includes four triangular test circuit areas 16 at the four corners thereof (i.e., A, B, C, D) that are outside the die seal ring 14. As shown in FIG. 2, within each test circuit area 16, a test circuit 20 for assessing chip integrity is fabricated. The test circuit 20 is a vertically extending serpentine electric path that is made from different levels of metals (e.g. $M_1$, $M_2$ and $M_3$) and contact/via plugs (e.g. $C_1$, $V_1$, $V_2$ and $V_3$). It is noted that one end of the serpentine electric path of the test circuit 20 may be contact plug 22 that is in contact with the underlying silicon substrate 100, and the other end of the serpentine electric path of the test circuit 20 is the solder pad or probe pad 28. The interlayer dielectrics and overcoat of the chip are not shown in the drawings.

According to one preferred embodiment, it is one kernel feature of this invention that each test circuit 20 formed within the test circuit areas 16 is electrically connected to the die seal ring 14. Such connection may be either via the metal interconnection, for example, first layer metal ($M_1$), which is shown in FIG. 2, or via the diffusion region formed in the silicon substrate 100, which is not shown in the drawings.

The interface delamination or cracking can be detected by probing two points of the four points A, B, C and D using a typical outer probing circuit. For example, by simultaneously probing the probe pad 28 of the test circuit thereof at point A and the probe pad 28 of the test circuit thereof at point B, which are electrically interconnected with each other via the die seal ring 14, interface delamination can be readily detected. Once the interface delamination occurs, the electric loop consisting of the test circuits at point A and B, the die seal ring 14, and the outer probing circuit, which was supposed to be a closed loop, is now open, and therefore no current is measured.

Figure 3:
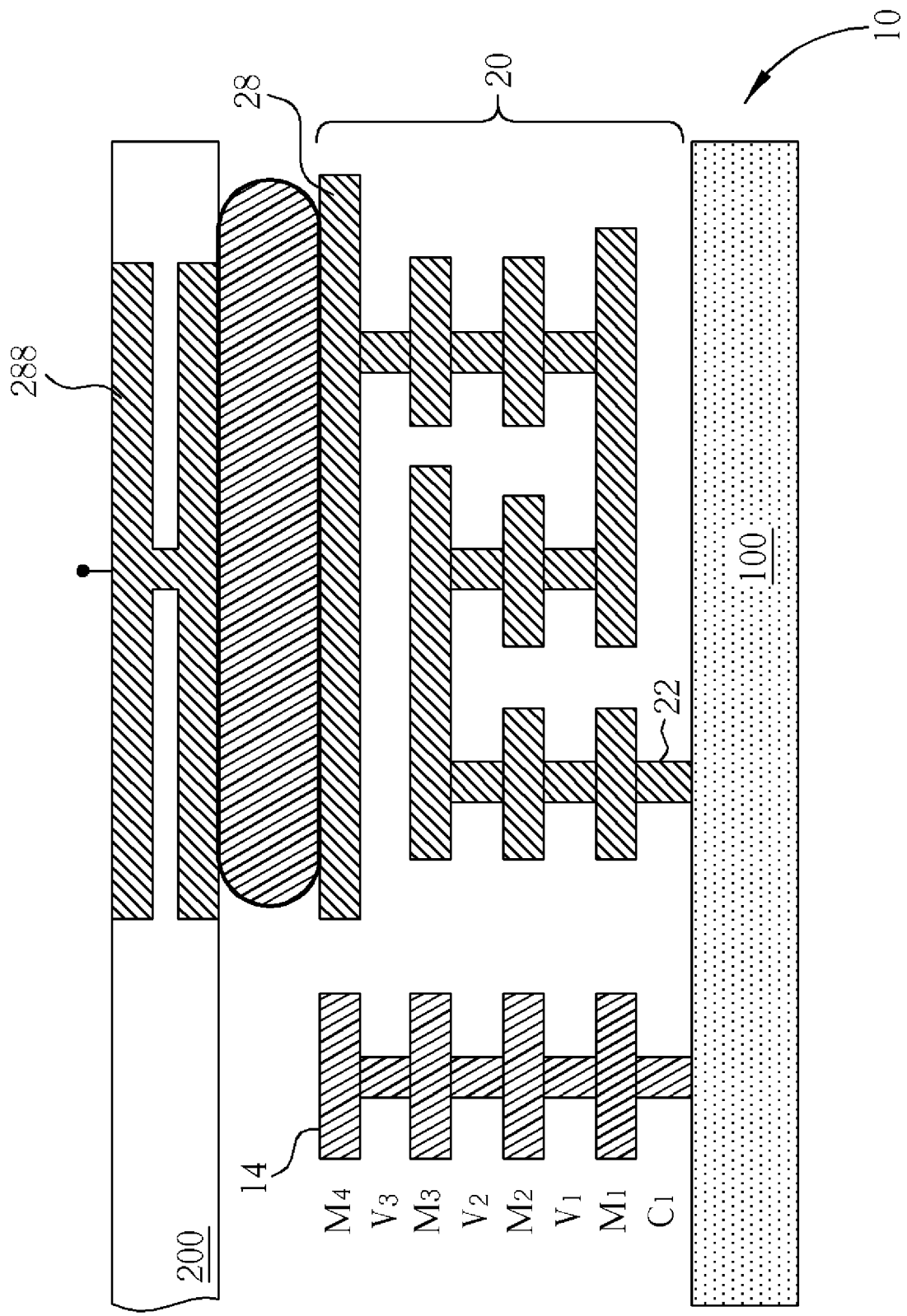
FIG. 3 is a schematic, cross-sectional view showing the on-chip test circuit after packaging.

Referring to FIG. 3, in another case, the pads 28 at four corners of the chip 10 are soldered and bonded to a packaging substrate 200 by flip-chip packaging technology. After packaging, the open test of any two points of the four points A, B, C and D of the chip 10 can be accomplished by probing two corresponding probing pads 228 provided on the packaging substrate 200.

Figure 4:
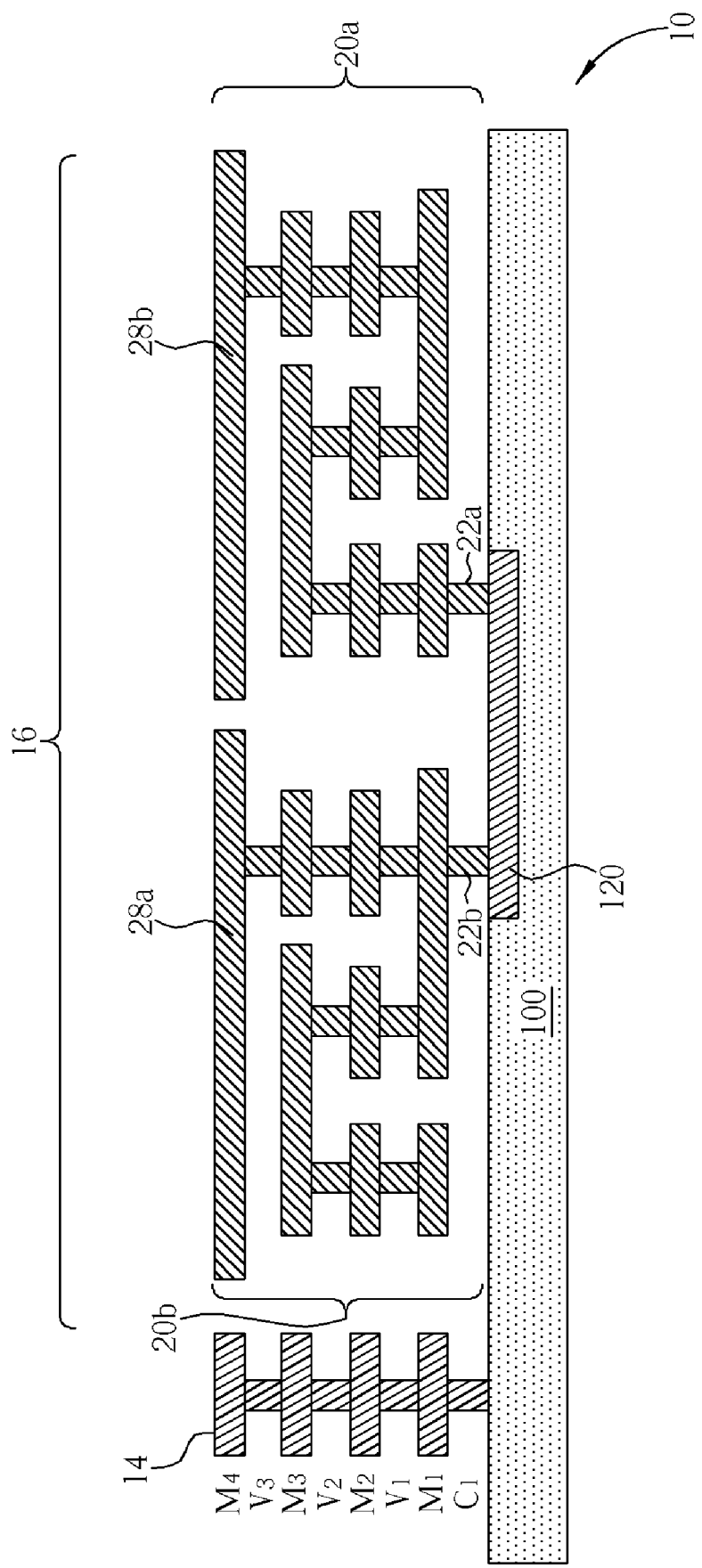
FIG. 4 is a schematic, cross-sectional view showing an on-chip test circuit constructed at corners of an integrated circuit chip or die for assessing chip integrity in accordance with another preferred embodiment of this invention.

Please refer to FIG. 4. FIG. 4 is a schematic, cross-sectional view showing an on-chip test circuit constructed at corners of an integrated circuit chip or die for assessing chip integrity in accordance with another preferred embodiment of this invention. As shown in FIG. 4, likewise, integrated circuit chip or die 10 includes an active integrated circuit 12 surrounded by a die seal ring 14, and four test circuit areas 16 at the four corners thereof that are outside the die seal ring 14. Within each test circuit area 16, two test circuits 20a and 20b for assessing chip integrity are fabricated.

The test circuit 20a is a vertically extending serpentine electric path that is made from different levels of metals and contact/via plugs. One end of the serpentine electric path of the test circuit 20a is contact plug 22a that is in contact with a diffusion region 120 implanted into the underlying silicon substrate 100, and the other end of the serpentine electric path of the test circuit 20a is the solder pad or probe pad 28a.

The test circuit 20b is a vertically extending serpentine electric path that is analogous to the structure of the test circuit 20a. Similarly, one end of the serpentine electric path of the test circuit 20b is contact plug 22b that is in contact with the diffusion region 120, and the other end of the serpentine electric path of the test circuit 20b is the solder pad or probe pad 28b. The test circuit 20a is electrically connected to the test circuit 20b via the diffusion region 120. In this embodiment, none of the test circuits 20a and 20b is electrically connected to the die seal ring 14. It is understood that the two neighboring test circuits 20a and 20b may be interconnected with each other via a layer of metal, but not via the diffusion region 120.

The interface delamination or cracking can be detected by probing two pads 28a and 28b of respective test circuits 20a and 20b of the chip 10 (test one corner at a time) using a typical outer probing circuit. For example, by simultaneously probing the probe pads 28a and 28b, which are electrically interconnected with each other via the diffusion region 120, interface delamination can be readily detected. Once the interface delamination occurs, the electric loop, which was supposed to be a closed loop, is now open, and therefore no current is measured.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor chip having test circuit for assessing chip integrity, comprising:
    an active inner circuit;
    a die seal ring surrounding the active inner circuit;
    a first circuit structure fabricated at a first corner of the semiconductor chip outside the die seal ring and electrically connected to the die seal, wherein the first circuit structure has a first solder pad; and
    a second circuit structure fabricated at a second corner of the semiconductor chip outside the die seal ring and electrically connected to the die seal, wherein the second circuit structure has a second solder pad;

wherein neither the first circuit structure nor the second circuit structure is a part of the die seal ring.

2. The semiconductor chip having test circuit for assessing chip integrity according to claim 1 wherein the die seal ring consists of a plurality of patterned metal layers, positioned on top of each other and mutually connected by via or contact plugs.

3. The semiconductor chip having test circuit for assessing chip integrity according to claim 1 wherein the first and second circuit structures are a vertically extending serpentine electric path.

4. A semiconductor chip having test circuit for assessing chip integrity, comprising:
an active inner circuit;
a die seal ring surrounding the active inner circuit;
a first circuit structure fabricated at a corner of the semiconductor chip outside the die seal ring, wherein the first circuit structure has a first solder pad and is not electrically connected to the die seal; and
a second circuit structure fabricated adjacent to the first circuit structure at the corner of the semiconductor chip and electrically connected to the first circuit structure, wherein the second circuit structure has a second solder pad;
wherein neither the first circuit structure nor the second circuit structure is a part of the die seal ring;
wherein by probing the first and second solder pads on the first and the second circuit structure simultaneously, interface delamination or chip cracking can be readily detected; once the interface delamination or chip cracking occurs, an electric loop, which was supposed to be a closed loop, is open, and therefore no current is measured.

5. The semiconductor chip having test circuit for assessing chip integrity according to claim 4 wherein the die seal ring consists of a plurality of patterned metal layers, positioned on top of each other and mutually connected by via or contact plugs.

6. The semiconductor chip having test circuit for assessing chip integrity according to claim 4 wherein the first and second circuit structures are a vertically extending serpentine electric path.

7. The semiconductor chip having test circuit for assessing chip integrity according to claim 4 wherein the first and second circuit structures are electrically connected to each other via a first layer metal.

8. The semiconductor chip having test circuit for assessing chip integrity according to claim 1 wherein by probing the first and second solder pads on the first and the second circuit structure simultaneously, the interface delamination or chip cracking can be readily detected; once the interface delamination or chip cracking occurs, an electric loop consisting of the first and the second circuits at the first corner and the second corner respectively, the die seal ring, and an outer probing circuit, which was supposed to be a closed loop, is open, and therefore no current is measured.

* * * * *